(12) United States Patent
Gao et al.

(10) Patent No.: US 8,996,919 B2
(45) Date of Patent: Mar. 31, 2015

(54) METHOD AND SYSTEM PROVIDNG A SELF-TEST ON ONE OR MORE SENSORS COUPLED TO A DEVICE

(71) Applicant: InvenSense, Inc., Sunnyvale, CA (US)

(72) Inventors: Ge Gao, Fremont, CA (US); William Kerry Keal, Santa Clara, CA (US); James Lim, Saratoga, CA (US)

(73) Assignee: InvenSense, Inc., San Jose, CA (US)

( * ) Notice: Subject to any disclaimer, the term of this patent is extended or adjusted under 35 U.S.C. 154(b) by 133 days.

(21) Appl. No.: 13/797,058

(22) Filed: Mar. 12, 2013

(65) Prior Publication Data

US 2013/0246848 A1 Sep. 19, 2013

Related U.S. Application Data

(60) Provisional application No. 61/610,421, filed on Mar. 13, 2012.

(51) Int. Cl.
 *G06F 11/00* (2006.01)
 *G06F 11/27* (2006.01)
 *G06F 11/22* (2006.01)

(52) U.S. Cl.
 CPC ............ *G06F 11/27* (2013.01); *G06F 11/2273* (2013.01)
 USPC .............................................. 714/35; 714/46

(58) Field of Classification Search
 CPC ............ G06F 11/2221; G06F 11/2268; G06F 11/2284; G06F 11/2273; G06F 11/26; G06F 11/27; G06F 11/3013; G06F 11/3089
 USPC ...................... 714/35, 36, 38.1, 40, 44, 46, 57
 See application file for complete search history.

(56) References Cited

U.S. PATENT DOCUMENTS

| | | | | |
|---|---|---|---|---|
| 6,047,124 A * | 4/2000 | Marsland | ....................... | 717/128 |
| 6,182,242 B1 * | 1/2001 | Brogan et al. | .................. | 714/26 |
| 6,385,739 B1 * | 5/2002 | Barton et al. | .................. | 714/25 |
| 6,769,117 B2 * | 7/2004 | Moore | .......................... | 717/130 |
| 7,437,716 B1 * | 10/2008 | Cantrill | ........................ | 717/128 |
| 7,810,103 B2 * | 10/2010 | Shier et al. | ..................... | 719/321 |
| 7,974,829 B2 * | 7/2011 | Ko | ................................. | 703/24 |
| 8,434,098 B2 * | 4/2013 | Lee et al. | ...................... | 719/321 |
| 8,677,118 B1 * | 3/2014 | Liu et al. | ....................... | 713/164 |
| 2001/0044904 A1 * | 11/2001 | Berg et al. | ..................... | 713/201 |
| 2002/0091966 A1 * | 7/2002 | Barton et al. | .................. | 714/25 |
| 2005/0015702 A1 * | 1/2005 | Shier et al. | ..................... | 714/776 |
| 2005/0197815 A1 * | 9/2005 | Grebenev | ........................ | 703/14 |
| 2006/0136785 A1 * | 6/2006 | Shu et al. | ........................ | 714/38 |
| 2007/0101220 A1 * | 5/2007 | So | ................................. | 714/724 |
| 2008/0276257 A1 * | 11/2008 | Fuchs et al. | ................... | 719/327 |
| 2009/0070632 A1 * | 3/2009 | Bag et al. | ........................ | 714/42 |
| 2009/0254294 A1 * | 10/2009 | Dutta | .............................. | 702/92 |
| 2009/0276793 A1 * | 11/2009 | Cabezas et al. | ............... | 719/321 |
| 2009/0307532 A1 * | 12/2009 | Raber | ............................. | 714/38 |
| 2011/0066395 A1 * | 3/2011 | Judd | ............................. | 702/104 |
| 2011/0246117 A1 * | 10/2011 | Moore et al. | .................... | 702/99 |
| 2012/0290718 A1 * | 11/2012 | Nethercutt | ..................... | 709/224 |
| 2012/0324292 A1 * | 12/2012 | Bhat et al. | .................... | 714/38.1 |

(Continued)

*Primary Examiner* — Marc Duncan
(74) *Attorney, Agent, or Firm* — Sawyer Law Group, P.C.

(57) ABSTRACT

A method and system for providing a self-test configuration in a device is disclosed. The method and system comprise providing a self-test mechanism in a kernel space of a memory and enabling a hook in a user space of the memory, wherein the hook is in communication with the self-test mechanism. The method and system also include running the self-test driver and utilizing the results.

26 Claims, 3 Drawing Sheets

(56) References Cited

U.S. PATENT DOCUMENTS

| | | | |
|---|---|---|---|
| 2013/0055341 A1* | 2/2013 | Cooper et al. | 726/1 |
| 2013/0086425 A1* | 4/2013 | Choi et al. | 714/32 |
| 2013/0096880 A1* | 4/2013 | Choi et al. | 702/182 |
| 2013/0138381 A1* | 5/2013 | Lee et al. | 702/123 |

* cited by examiner

METHOD AND SYSTEM PROVIDNG A SELF-TEST ON ONE OR MORE SENSORS COUPLED TO A DEVICE

CROSS REFERENCE TO RELATED APPLICATION

This application claims the benefit of priority of U.S. Patent Application No. 61/610,421, filed on Mar. 13, 2012, entitled "SELF-TEST METHOD IN LINUX DEVICE DRIVER FOR SENSOR", which is incorporated herein by reference.

FIELD OF THE INVENTION

The present invention relates generally to a device which receives data from one or more sensors and more particularly to a self-test utilized within such a device.

BACKGROUND OF THE INVENTION

A driver is a computer program which allows higher-level computer programs to interact with a hardware device. A sensor is a chip that can detect physical quantity and convert it into electronic signals that is readable by computer programs within the device. A driver is necessary for a processor to interact with a sensor.

Conventionally, a self-test program is a separate program that runs in the user space of a memory associated with the device. This has several disadvantages. First, the self-test program is a separate program from the driver, and therefore could be lost or mismatched with the driver. If the driver is upgraded to a newer version and an old self-test program is used, an incorrect result could be generated.

Second, providing the self-test program within in the user space is more complicated because a separate software program has to be copied into the operating system of the device. This may not be convenient or even not allowed in some situations. Third, it provides for the possibility of a hacker providing a fake self-test program. If a fake program is utilized to provide the self-test function the result is completely un-predictable.

Accordingly what is needed is a system and method that addresses the above identified issues. The present invention addresses such a need.

SUMMARY OF THE INVENTION

A method and system for providing a self-test in a device is disclosed. The method and system comprise providing a self-test mechanism in a kernel space of a memory and enabling a hook in a user space of the memory, wherein the hook is in communication with the self-test mechanism. The method and system also includes running the self-test mechanism based on a user input via the self-test hook and utilizing the results.

DETAILED DESCRIPTION

The present invention relates generally to a device which receives data from one or more sensors and more particularly to a self-test configuration utilized within such a device. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
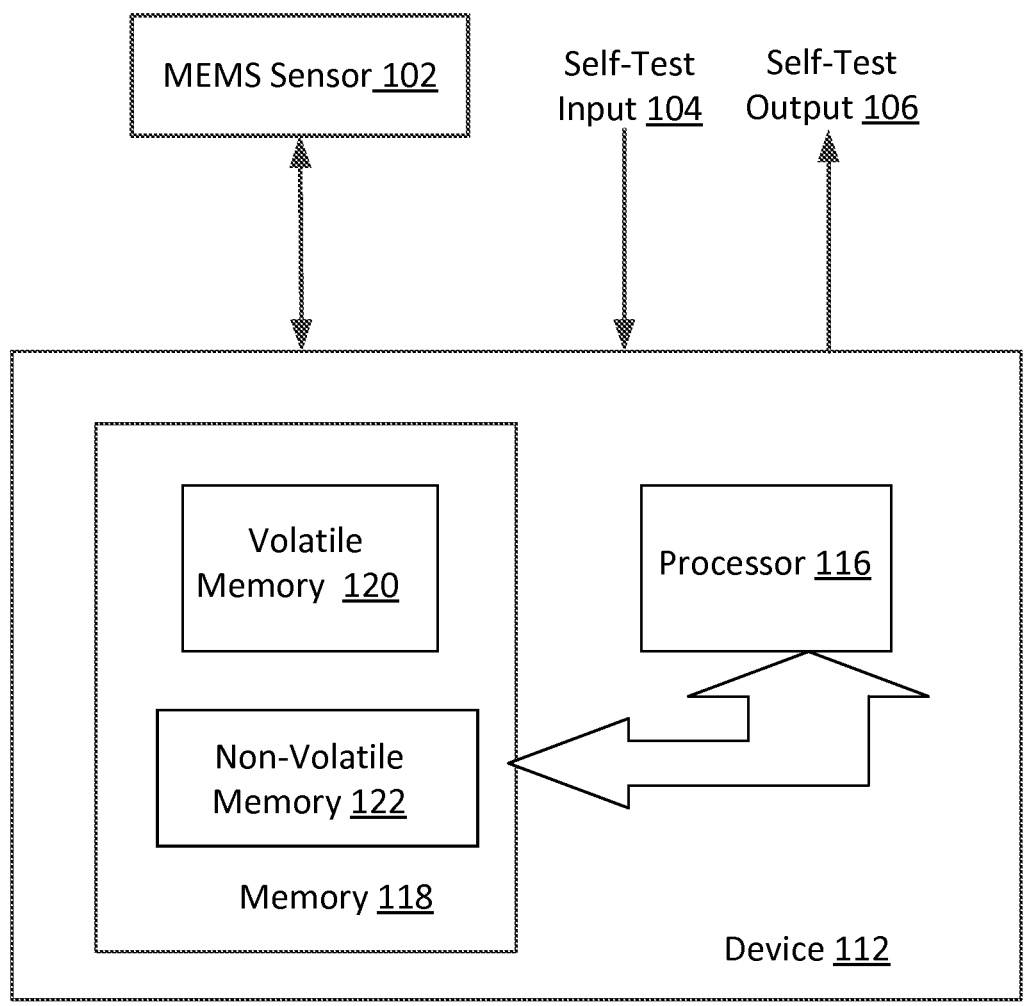
FIG. 1 illustrates a hardware device coupled to one or more sensors.

FIG. 1 illustrates system 100 that includes a hardware device 112 coupled to one or more sensors 102. In this embodiment, the sensors are a MEMS sensor 102. However one of ordinary skill in the art readily recognizes that the sensors could be any number and/or any type and their use would be within the spirit and scope of the present invention. For example the types of sensors that could used include and are not limited to accelerometers pressure sensors, temperature gyroscopes and any other type of sensors, motion sensing or otherwise. The device 112 includes a processor 116 and a memory 118 which is in communication with the processor 116. The memory 118 includes a volatile memory 120 and a non-volatile memory 122. System 100 receives self-test input 104 and executes the self-test on the sensors and returns the self-test result.

In an embodiment, the sensors can include MEMS accelerometers, gyroscope, magnetometer and pressure sensors. Some embodiments include accelerometer, gyroscope, and magnetometer each provide measurement along three axis orthogonal to each other. Other embodiments may not include all the sensors or may provide measurements along one or more axis. The sensors are formed on a first substrate.

The device 100 further includes electronic circuit to receive the measurement outputs. The electronic circuit is implemented on a second silicon substrate. The first substrate is vertically bonded to the second substrate. In one embodiment, the first substrate is bonded to the second substrate through wafer bonding, as described in commonly owned U.S. Pat. No. 7,104,129 (assigned to the assignee of the present application and incorporated herein by reference above) that simultaneously provides electrical connections and hermetically seals the MEMS devices. This unique and novel fabrication technique is the key enabling technology that allows for the design and manufacture of high performance, multi-axis, inertial sensors in a very small and economical package. Integration at the wafer-level minimizes parasitic capacitances, allowing for improved signal-to-noise relative to a discrete solution. Such integration at the wafer-level also enables the incorporation of a rich feature set which minimizes the need for external amplification.

Accordingly, a system and method in accordance with the present invention addresses these issues. A method and system for providing a self-test configuration in a device is disclosed. The system and method comprise providing a self-test mechanism in a kernel space of a memory and enabling a hook in a user space of the memory, wherein the hook is in communication with the self-test mechanism. The method also includes running the self-test driver and returning the results to a user.

In so doing, the above identified difficulties are overcome. To describe the features of the present invention in more detail refer now to the following description in conjunction with the accompanying figures.

A system that utilizes self-test process in accordance with the present invention can take the form of an entirely hardware implementation, an entirely software implementation, or an implementation containing both hardware and software elements. In one implementation, this disclosure is implemented in software, which includes, but is not limited to, application software, firmware, resident software, microcode, etc.

Furthermore, this managing application process can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include DVD, compact disk-read-only memory (CD-ROM), and compact disk-read/write (CD-R/W).

Figure 2:
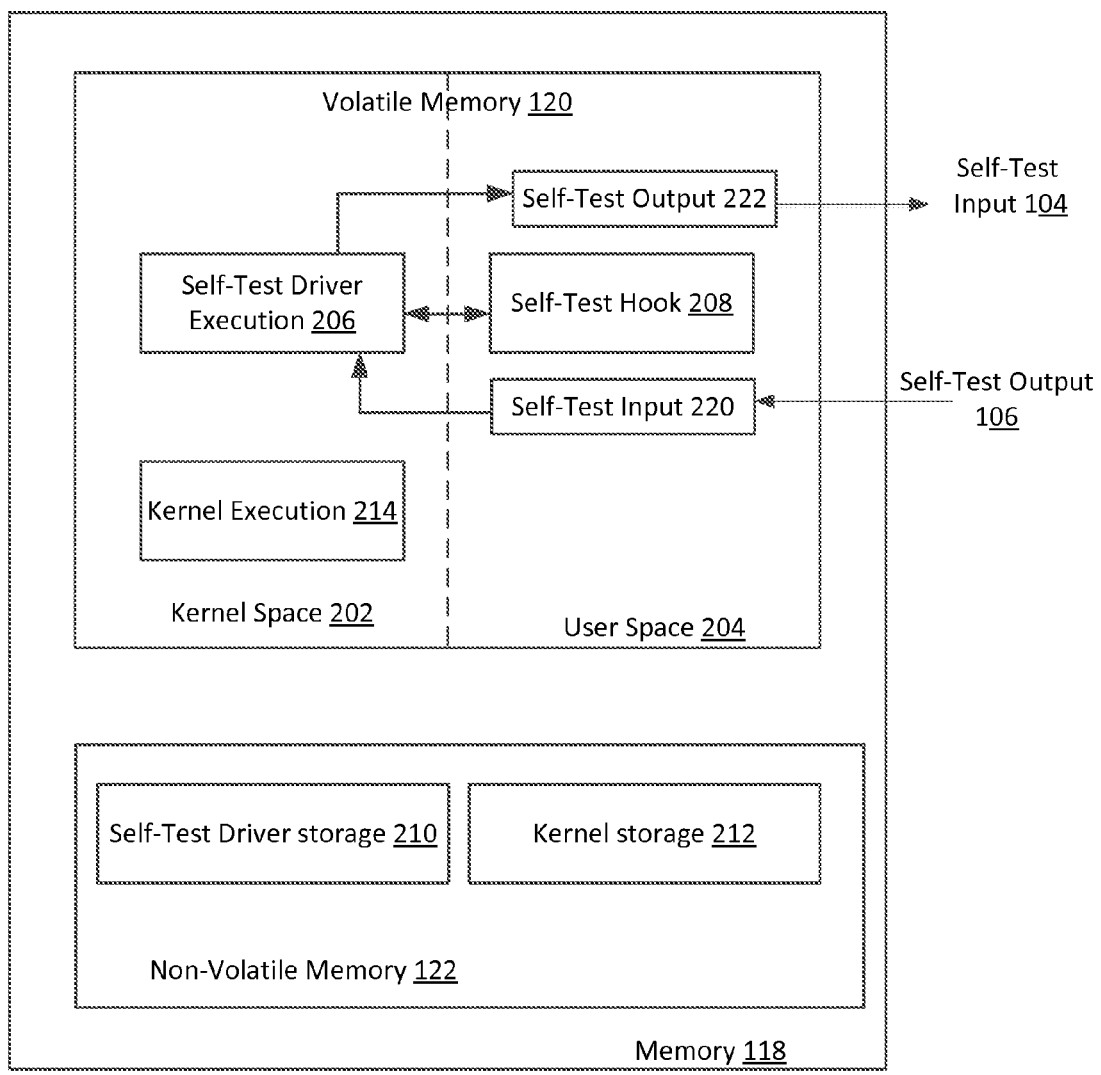
FIG. 2 shows a more detailed view of the memory which is utilized with a system and method in accordance with the present invention.

FIG. 2 shows a more detailed view of the memory 118 which is utilized with a system and method in accordance with the present invention. The memory 118 includes a volatile memory 120 and non-volatile memory 122. Volatile memory 120 includes of a kernel space 202 and user space 204. Kernel space 202, includes the self-test driver execution space 206 and kernel section space 214 and Self-test hook 208 resides in the user-space. Self-test input 220 is stored in user space before executing self-test, similarly, self-test output 222 is stored in user space 204 before returning the result to the user. The self-test driver execution 206 is in communication with the self-test hook 208. The non-volatile memory 122 stores the self-test driver 210 and kernel 212.

Figure 3:
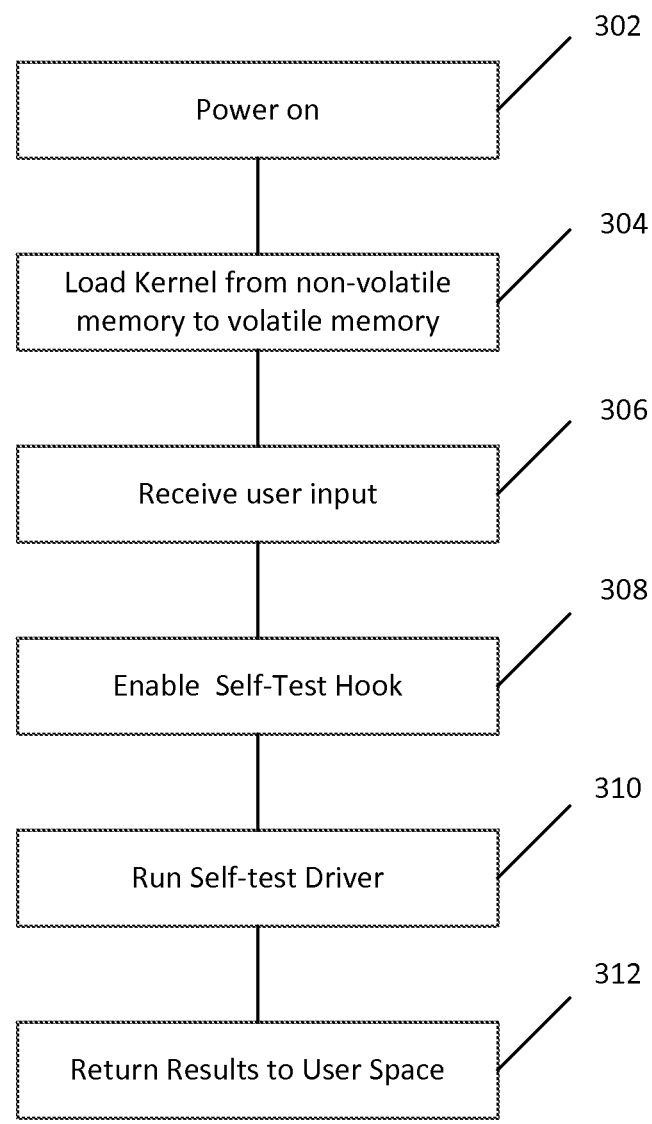
FIG. 3 is a flow chart of a self-test process in accordance with the present invention.

FIG. 3 is a flow chart of a self-test process in accordance with the present invention. Referring to FIGS. 2 and 3 together, first power is applied to the device 112, via step 302. Then, a kernel is loaded from non-volatile memory 122 to volatile memory 120, via step 304. Next an input is received by the device, via step 306. Thereafter, a self-test hook is enabled, via step 308. The self-test driver is run based upon that hook, via step 310. Then the results of the self-test are provide to the user space, via step 312.

Referring back to FIG. 2, the volatile memory 122 is divided into two spaces, a kernel space 202 and user space 204. The kernel space 202 is strictly for an operating system kernel (such as Linux, Mozilla or Windows) and driver programs and is protected from unauthorized changes from user space 204. User space 204 is where normal user programs are running. Kernel 202 and driver programs 206 usually expose some handlers to user space 204 so that the user can use these services.

As an example, Sysfs is a command utilized in Linux to export information about device drivers to the user space 204 and is also used for configuration. A device driver could have many configurations such as data rate, sample rate, etc. These configurations are exposed as separate files in a specified directory that the user space 204 can access. If a user wants to change one configuration, all the user needs to do is write to this file like writing to a normal file. Some settings are for information only. The files corresponding to these settings are set as read-only. User space 202 programs can read these files like reading a normal file. The output of these read actions are the configuration values. For example, to get current sample rate "cat sample_rate" command can be executed in the directory containing the sysfs file "sample_rate". The value of the sample rate will be returned to user. The command "cat" is a Linux command that reads a file and returns the result to the standard output, i.e., the screen in normal situations. The file "sample_rate" is one of the device driver's settings that stores the current value of the sample rate.

The self-test function is provided in the device driver code and is a file in a directory along with device driver's other configurations. For example, this file could be called "self_test". A command "cat self_test" would trigger the driver to set the device 112 to pre-determined settings and perform a self-test. The test result "pass/fail" would return to user as the result of "cat self_test".

A system and method in accordance with the present invention has several advantages over conventional self-test mechanisms. Firstly, one program performs the entire function. Hence, there are no mismatch/version problems. Furthermore the self-test mechanism is part of the kernel space. Therefore the self-test function is protected and cannot be changed once the operating system starts running. Also, the user interface is simple. Typically the command can be an operating system built in command. Finally, it is easier to run the self-test function during manufacturing because the easy interface and the whole software system does not need to be brought.

For example, the command "cat" is a built-in command of the Linux operating system. The simplest "bare-bone" kernel has this command. Therefore, no special program is required to install in order to perform the test. A system and method in accordance with the present invention allows for the self-test function to be contained in the driver and exposed into a system interface.

Another feature of the present invention is that the self-test driver can include a calibration function. For instance, with a MEMs gyroscope, often there is bias. If a user requirement is to not move the device while running the self-test, then while taking test data, the average of the gyroscope sensor output will be the gyroscope bias. This information can then be used by either the driver or a calling program to calibrate the gyroscope by saving and removing this bias. Often, for a self-test for gyroscopes, the sensor has to be stationary ensuring the user constraint of no motion for a proper self-test. If a further user constraint is given for accelerometers such that one of the axes of the accelerometers sensor is parallel to earth's gravity field (one example is being laid flat with respect to the earth's gravity), then the accelerometer can also be calibrated while running the self-test. When lying flat, the sensor should have a known value. Any deviation from the known value would be the bias on the accelerometer. This bias can also be saved and removed by either the driver or the calling program.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A computer implemented method for providing a self-test on one or more sensors coupled to a device, the method comprising:
    enabling a hook in a user space of a memory, wherein the hook is in communication with a self-test mechanism;
    receiving a user input via the hook;
    executing the self-test mechanism in a kernel space of the memory within the device; and
    returning the results to the user space; wherein the returning step includes returning the results to the user.

2. The computer implemented method of claim 1, wherein the hook comprises a file.

3. The computer implemented method of claim 1, wherein the memory comprises a nonvolatile memory and a volatile memory.

4. The computer implemented method of claim 3, wherein the user space and the kernel space are within the volatile memory.

5. The computer implemented method of claim 3, wherein the nonvolatile memory stores the self-test mechanism.

6. The computer implemented method of claim 1, wherein the self-test mechanism comprises a self-test driver.

7. The computer implemented method of claim 1, wherein the method is run during manufacturing.

8. The computer implemented method of claim 1, wherein the results are the sampling rates of one of the one or more sensors.

9. A device comprising:
    one or more sensors;
    a processing system; and
    a memory system in communication with the processing system, the memory including a volatile memory and a nonvolatile memory; wherein the nonvolatile memory stores a self-test mechanism for the one or more sensors coupled to the device, wherein the volatile memory comprises a kernel space and a user space; wherein the self-test mechanism is executed in the kernel space based upon a hook in the user space, wherein the hook is enabled by a user input, wherein results from the self-test mechanism are utilized.

10. The device of claim 9, wherein the self-test mechanism comprises a self-test driver.

11. The device of claim 9, wherein the utilizing comprises returning the results to the user.

12. The device of claim 9, wherein the results are utilized for calibrating one of the one or more sensors.

13. The device of claim 9, wherein the results are the sampling rates of one of the one or more sensors.

14. A non-transitory computer program product stored on a computer readable medium, a computer readable program means for causing a computer to control an execution of an application to perform a method for providing a self-test on one or more sensors coupled to a device, the method comprising:
    enabling a hook in a user space of a memory, wherein the hook is in communication with a self-test mechanism;
    receiving a user input via the hook;
    executing the self-test mechanism in a kernel space of the memory within the device; and
    returning the results to the user space; wherein the returning step includes returning the results to the user.

15. The non-transitory computer program product of claim 14, wherein the memory comprises a nonvolatile memory and a volatile memory.

16. The non-transitory computer program product of claim 15, wherein the user space and the kernel space are within the volatile memory.

17. The non-transitory computer program product of claim 15, wherein the nonvolatile memory stores the self-test mechanism.

18. The non-transitory computer program product of claim 14, wherein the self-test mechanism comprises a self-test driver.

19. The non-transitory computer program product of claim 14 wherein the results are utilized for calibrating one of the one or more sensors.

20. The non-transitory computer program product of claim 14, wherein the results are the sampling rates of one of the one or more sensors.

21. A computer implemented method for providing a self-test on one or more sensors coupled to a device, the method comprising:
    enabling a hook in a user space of a memory, wherein the hook is in communication with a self-test mechanism;
    receiving a user input via the hook;
    executing the self-test mechanism in a kernel space of the memory within the device; and
    returning the results to the user space; wherein the results are utilized for calibrating one of the one or more sensors.

22. The computer implemented method of claim 21, wherein the hook comprises a file.

23. The computer implemented method of claim 21, wherein the memory comprises a nonvolatile memory and a volatile memory.

24. The computer implemented method of claim 23, wherein the user space and the kernel space are within the volatile memory.

25. The computer implemented method of claim 23, wherein the nonvolatile memory stores the self-test mechanism.

26. The computer implemented method of claim 21, wherein the self-test mechanism comprises a self-test driver.

* * * * *